(12) United States Patent
Fanning et al.

(10) Patent No.: US 11,382,240 B2
(45) Date of Patent: Jul. 5, 2022

(54) SELF-EXPANDING GAP FILLER FOR DECREASING AIR LEAKAGE BETWEEN ADJACENT ELEMENTS IN A DATA CENTER

(71) Applicant: TechnoGuard Inc., Sterling, VA (US)

(72) Inventors: Brian T. Fanning, Leesburg, VA (US); Alfred B. Cook, Potomac Falls, VA (US)

(73) Assignee: TECHNOGUARD INC., Sterling, VA (US)

( * ) Notice: Subject to any disclaimer, the term of this patent is extended or adjusted under 35 U.S.C. 154(b) by 0 days.

(21) Appl. No.: 17/138,187

(22) Filed: Dec. 30, 2020

(65) Prior Publication Data

US 2021/0120702 A1    Apr. 22, 2021

Related U.S. Application Data

(63) Continuation of application No. 16/431,443, filed on Jun. 4, 2019, now Pat. No. 10,912,228, which is a
(Continued)

(51) Int. Cl.
*H05K 7/20* (2006.01)
*H05K 7/14* (2006.01)
(Continued)

(52) U.S. Cl.
CPC ....... *H05K 7/20745* (2013.01); *H05K 7/1488* (2013.01); *H05K 7/20736* (2013.01); *B32B 3/04* (2013.01); *B32B 5/18* (2013.01)

(58) Field of Classification Search
CPC .......... H05K 7/20745; H05K 7/20735; H05K 7/20736; H05K 7/1488; H05K 14/888; B32B 3/04; B32B 5/18; B32B 2266/08
See application file for complete search history.

(56) References Cited

U.S. PATENT DOCUMENTS

| | | |
|---|---|---|
| 2,016,233 A | 5/1933 | Herman |
| 2,983,963 A | 5/1961 | Jodell et al. |

(Continued)

FOREIGN PATENT DOCUMENTS

JP    59-88530 A    5/1984

*Primary Examiner* — Zachary Pape
*Assistant Examiner* — Amir A Jalali
(74) *Attorney, Agent, or Firm* — Birch, Stewart, Kolasch & Birch, LLP

(57) ABSTRACT

A data center having a hot aisle, a cold aisle, a row of server rack cabinets located between the cold aisle and the hot aisle, and a self-expanding gap filler located in a gap between adjacent elements in the data center is provided. The self-expanding gap filler includes a compressible material and an outer layer having an outer surface and an inner surface, the inner surface defining an inner space, the outer layer encapsulating the compressible material within the inner space. The compressible material is configured to expand from a compressed state within the inner space of the outer layer to an expanded state within the inner space of the outer layer in response to a seal being at least partially released within the outer layer to allow air to flow into the inner space of the outer layer, whereby the self-expanding gap filler at least partially fills the gap between the adjacent elements in the data center.

16 Claims, 9 Drawing Sheets

Related U.S. Application Data continuation of application No. 15/483,323, filed on Apr. 10, 2017, now Pat. No. 10,327,360.

(60) Provisional application No. 62/321,057, filed on Apr. 11, 2016.

(51) Int. Cl.
     *B32B 3/04*     (2006.01)
     *B32B 5/18*     (2006.01)

(56) References Cited

U.S. PATENT DOCUMENTS

| | | | | |
|---|---|---|---|---|
| 3,425,890 | A * | 2/1969 | Powers | C08J 9/36 521/52 |
| 8,270,170 | B2 * | 9/2012 | Hughes | H05K 7/20 361/710 |
| 8,934,242 | B2 | 1/2015 | Bean, Jr. et al. | |
| 9,007,762 | B2 * | 4/2015 | Toya | H05K 7/1495 361/679.46 |
| 9,198,310 | B2 | 11/2015 | Eichelberg | |
| 9,690,337 | B1 | 6/2017 | Eichelberg et al. | |
| 2004/0190255 | A1 * | 9/2004 | Cheon | H05K 7/20254 361/699 |
| 2008/0035788 | A1 * | 2/2008 | Kothera | B63B 1/248 244/99.8 |
| 2009/0157032 | A1 * | 6/2009 | MacDonald | A61F 13/495 604/379 |
| 2009/0188614 | A1 * | 7/2009 | Ota | A61F 7/034 156/256 |
| 2010/0188816 | A1 * | 7/2010 | Bean, Jr. | H05K 7/20745 361/696 |
| 2012/0229972 | A1 | 9/2012 | Bean | |
| 2013/0021669 | A1 * | 1/2013 | Xi | B82Y 20/00 359/578 |
| 2013/0161273 | A1 | 6/2013 | Borowsky | |
| 2014/0254089 | A1 * | 9/2014 | Eichelberg | H05K 7/20745 361/679.46 |
| 2015/0091192 | A1 * | 4/2015 | Shin | H05K 3/323 257/775 |
| 2017/0311487 | A1 * | 10/2017 | Rau | G06F 1/20 |
| 2018/0087350 | A1 * | 3/2018 | Sherman | E21B 43/086 |
| 2019/0076685 | A1 * | 3/2019 | Johnson | A62C 37/11 |
| 2019/0153729 | A1 * | 5/2019 | Moller | B32B 21/08 |
| 2021/0197735 | A1 * | 7/2021 | Nardella, Sr. | B32B 15/085 |

* cited by examiner

SELF-EXPANDING GAP FILLER FOR DECREASING AIR LEAKAGE BETWEEN ADJACENT ELEMENTS IN A DATA CENTER

CROSS-REFERENCE TO RELATED APPLICATIONS

This application is a Continuation Application of U.S. application Ser. No. 16/431,443, filed Jun. 4, 2019, which is a Continuation Application of U.S. application Ser. No. 15/483,323, filed Apr. 10, 2017, now U.S. Pat. No. 10,327,360 B2, issued Jun. 18, 2019, which claims the benefit of U.S. Provisional Application No. 62/321,057, filed Apr. 11, 2016, which are all herein expressly incorporated by reference in their entireties.

BACKGROUND OF THE INVENTION

The present invention is directed generally to a method for decreasing air leakage between adjacent elements in a data center and, more particularly, placing a self-expanding gap filler in a gap between adjacent elements in a data center.

The self-expanding gap filler is useable in the field of data centers in which it is important to provide proper airflow control/blockage, particularly, in data centers that include hot and cold aisles. Typically, in these data centers, hot and cold aisles are provided separate from each other through the use of containment components such as physical structures of walls, doors, and blanking panels. In addition, these data centers will include multiple server rack cabinets associated with a hot aisle and a cold aisle. The server rack cabinets may take the form of a steel vertical box about two feet wide and six to seven feet tall. Within each server rack cabinet, one or more stacked computing devices, which may include computer servers and associated components, are provided. The server rack cabinets are arranged such that a front of the server rack cabinet is located at the cold aisle and a rear of the server rack cabinet is located at the hot aisle. With this arrangement, cooling air is provided to the cold aisle, drawn through the computing devices, and heated air is discharged to the hot aisle. The flow of air through the server rack cabinets can be influenced by individual fans of the computer servers as well as the air circulation system between the hot aisle and the cold aisle.

Due to the fast growing data center market and massive power consumption associated with its infrastructure, the need to conserve resources is of utmost importance in using these data centers. Separating data centers into hot and cold aisles by use of containment vastly increases cooling capacities and has huge energy saving benefits. The amount of savings directly correlates with the quality of separation between the hot and cold aisles. However, because server rack cabinets can vary in size, shape and deployment within a data center, gaps may exist between adjacent server rack cabinets, between server rack cabinets and a floor, and between the server rack cabinets and a containment system using hot and cold aisles. These gaps may allow undesirable air mixture to occur as heated air may escape from the hot aisle through the gaps and mix with cooling air provided to the cold aisle, thereby increasing the temperature of the cooling air before it is drawn through the computing devices located in the server rack cabinets. Based on the various configurations of the server rack cabinets, these gaps can be located in very tight spots or hard to reach areas.

BRIEF SUMMARY OF THE INVENTION

Accordingly, it is an object of the present invention to address the air leakage between the hot aisle and the cold aisle to improve cooling efficiency and decrease cost.

According to principles of this invention, a method of at least partially filling a gap between adjacent elements in a data center having a hot aisle and a cold aisle to decrease air leakage between the hot aisle and the cold aisle through the gap is provided. The method includes providing a self-expanding gap filler having a compressible material and an outer layer having an outer surface and an inner surface, the inner surface defining a sealed inner space, the outer layer encapsulating the compressible material in a compressed state within the inner space. The method further includes placing the self-expanding gap filler in the gap between the adjacent elements in the data center and at least partially releasing a seal within the outer layer to allow air to flow into the inner space of the outer layer to permit the compressible material to expand from the compressed state within the inner space of the outer layer to an expanded state within the inner space of the outer layer, thereby at least partially filling the gap between the adjacent elements in the data center.

According to a further aspect of the present invention, the adjacent elements may include two server rack cabinets such that the gap is located between adjacent sides of the two server rack cabinets. Placing the self-expanding gap filler in the gap may include inserting the self-expanding gap filler in a direction from a front of the two server rack cabinets towards a rear of the two server rack cabinets.

In still a further aspect of the present invention, a size of the gap at the front of the two server rack cabinets may be less than a size of the gap at a location intermediate of the front of the two server rack cabinets and the rear of the two server rack cabinets, a size of the self-expanding gap filler with the compressible material in the compressed state may be less than the size of the gap at the front of the two server rack cabinets, and a size of the self-expanding gap filler with the compressible material in the expanded state may be greater than the size of the gap at the front of the two server rack cabinets.

According to another aspect of the present invention, the adjacent elements may include a floor of the data center and at least one server rack cabinet having a bottom such that the gap is located between the floor of the data center and the bottom of the server rack cabinet. Placing the self-expanding gap filler in the gap may include inserting the self-expanding gap filler in a direction from a front of the at least one server rack cabinet towards a rear of the at least one server rack cabinet.

In a further aspect of the present invention, a height of the gap at the front of the server rack cabinet is less than a height of the gap at a location intermediate of the front of the at least one server rack cabinet and the rear of the at least one server rack cabinet, a height of the self-expanding gap filler with the compressible material in the compressed state may be less than the height of the gap at the front of the server rack cabinet, and a height of the self-expanding gap filler with the compressible material in the expanded state may be greater than the height of the gap at the front of the server rack cabinet.

In one aspect of the present invention, providing the self-expanding gap filler may include providing a vacuum state within the inner space of the outer layer. In addition, at least partially releasing the seal may include puncturing the outer layer.

In yet another aspect of the present invention, the self-expanding gap filler may include a valve. In addition, at least partially releasing the seal may include opening the valve.

In still another aspect of the present invention, the self-expanding gap filler may include a rib and groove closure.

In addition, at least partially releasing the seal includes opening the rib and groove closure.

In another aspect of the present invention, the self-expanding gap filler may include four sealed edges to define a perimeter of the self-expanding gap filler. In addition, at least partially releasing the seal includes breaking one of the four sealed edges.

In yet another aspect of the present invention, prior to at least partially releasing the seal, the outer layer may compress the compressible material along an entire length thereof in the compressed state.

In still another aspect of the present invention, providing the self-expanding gap filler may include providing the outer layer, placing the compressible material in the outer layer, compressing the compressible material, and sealing the outer layer to encapsulate the compressible material. In addition, at least partially releasing the seal may include puncturing the outer layer.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE INVENTION

Referring now in detail to the drawings for the purpose of illustrating exemplary embodiments of the present invention, a self-expanding gap filler 100 useable in a method of at least partially filling a gap between adjacent elements in a data center having a hot aisle and a cold aisle to decrease air leakage between the hot aisle and the cold aisle through the gap is shown in FIGS. 1A-4. The self-expanding gap filler 100 includes an outer layer 110 and a compressible material 120. The outer layer 110 has an outer surface and an inner surface, in which the inner surface may define a sealed inner space. The outer layer 110 encapsulates the compressible material 120 in a compressed state within the inner space prior to deployment in the data center.

Figure 1A:
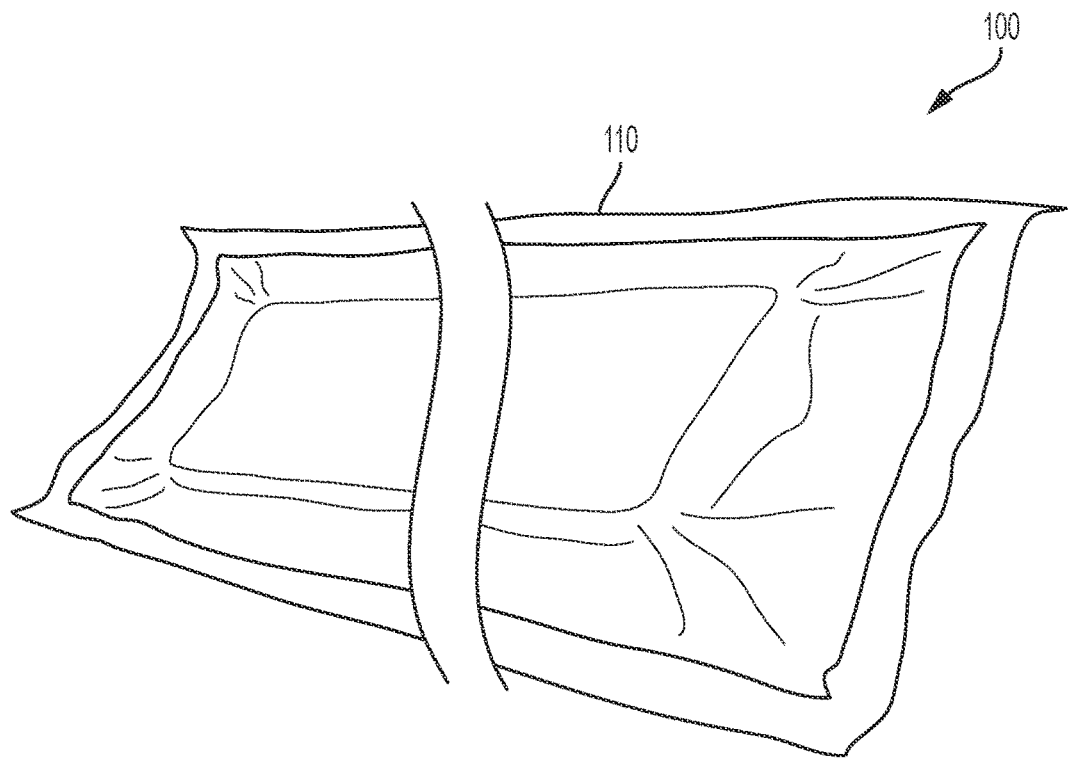
FIG. 1A illustrates a self-expanding gap filler in a compressed state and FIG. 1B illustrates a self-expanding gap filler in an expanded state according to an embodiment of the present invention.
Figure 1B:
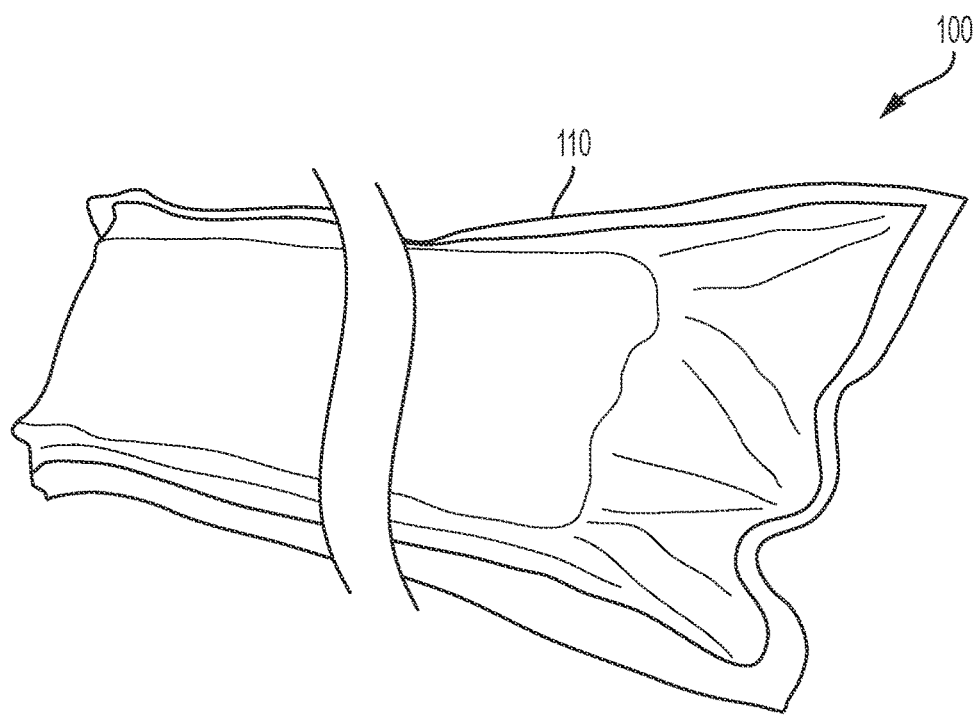

In this exemplary embodiment of the self-expanding gap filler 100, the compressible material 120 may be first compressed, then vacuumed sealed in the outer layer 110. Alternatively, the compressible material 120 may simply be compressed before being sealed in the outer layer 110. As shown in FIGS. 1A and 1B, the self-expanding gap filler 100 has a thin profile when the outer layer 110 is sealed after compressing the compressible material 120 (FIG. 1A) and a larger profile after at least partially releasing a seal within the outer layer 110 to allow air to flow into the inner space of the outer layer 110 to permit the compressible material 120 to expand from the compressed state within the inner space of the outer layer to an expanded state within the inner space of the outer layer (FIG. 1B). The thin profile and large profile may be selected so as to fit into various gaps between adjacent elements of a data center, which will be discussed below.

Figure 2:
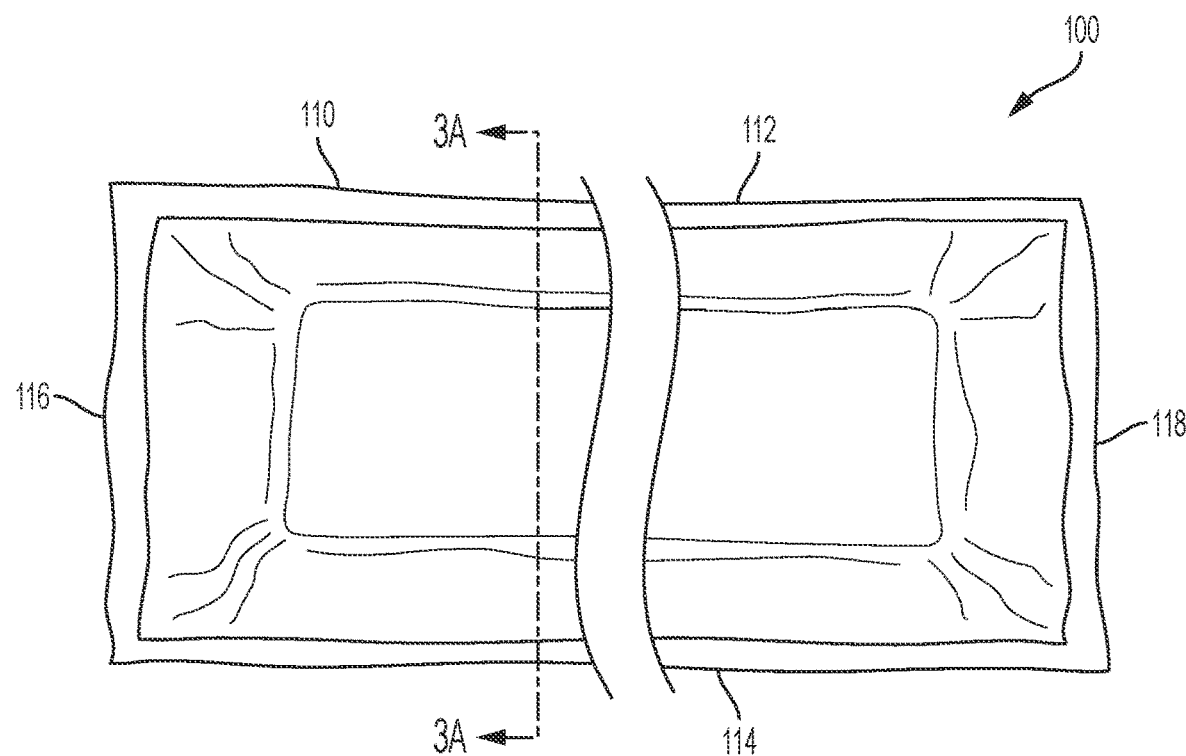
FIG. 2 illustrates a plan view of the self-expanding gap filler shown in FIG. 1B.

While FIGS. 1A, 1B and 2 show the self-expanding gap filler 100 being of indeterminate length, it is understood that the overall length of the self-expanding gap filler 100 can be selected based on environment constraints and may come in various lengths including, but not limited to, 12 inches, 24 inches, 30 inches, and 96 inches.

The outer layer 110 may have a tubular configuration having two long, sealed edges 112, 114 and two short, sealed edges 116, 118 to enclose the compressible material 120 located in the outer layer 110. The outer layer 110 may be made to any desirable size, length, width or shape depending on the gap to be filled upon expansion of the compressible material 120. While the outer layer 110 has been shown with four sealed edges, it is understood that other configurations of an outer layer can be provided. For example, it may be possible to eliminate one or more of the sealed sides such that the outer layer has a continuous appearance so long as the outer layer 110 can be sealed after the compressible material 120 has been compressed.

The outer layer 110 may be formed of a variety of materials including, but not limited to, Polyethylene (PE), Polypropylene (PP), Polyvinylchloride (PVC), Polyester (PET), or Polyamide (PA). The material of the outer layer 110 should be sufficiently strong to allow a vacuum pressure to be applied to assist in the compression of the compressible material 120 prior to sealing of the outer layer 110. Depending on the particular environment in which the self-expanding gap filler is going to be used, the material may be selected to be air impermeable, non-absorbent, and/or non-dust generating. For example, because the self-expanding gap filler 100 may be vacuum sealed, using an air impermeable material would allow the self-expanding gap filler 100 to remain in a compressed state until the vacuum seal is specifically released. In addition, because the self-expanding gap filler 100 may be used in a data center, using a non-absorbent and/or non-dust generating material may prevent degradation of the outer layer 110, which could otherwise interfere with the cooling system or computing devices of the data center.

Figure 3A:
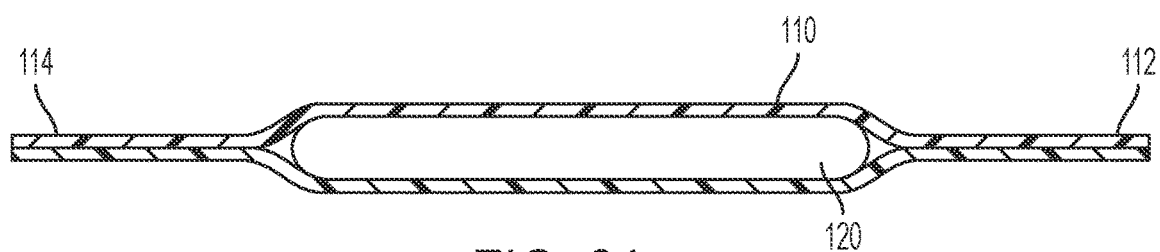
FIG. 3A illustrates a cross-sectional view of the self-expanding gap filler taken along the line of FIG. 2 in a compressed state.
Figure 3B:
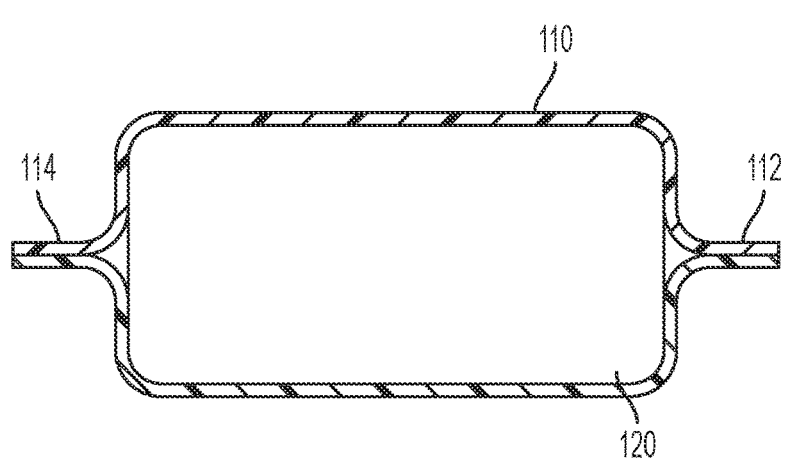
FIG. 3B illustrates the cross-sectional view of the self-expanding gap filler taken along the line of FIG. 2 in an expanded state.

As shown in FIGS. 3A and 3B, the compressible material 120 fits within the outer layer 110 and must be compressible and expandable within the inner space of the outer layer 110 to enable the self-expanding gap filler 100 to be expandable from the thin profile (FIG. 3A) to the larger profile (FIG. 3B) to conform to various gaps. The self-expanding gap filler can be provided with various compressed thicknesses including, but not limited to, ⅛ inch to ½ inch, and can expand to various expanded thicknesses including, but not limited to, 1 inch to 3½ inches. While FIG. 3A shows inner surfaces of the outer layer 110 contacting each other, it is understood that this entire area does not necessarily constitute the sealed sides, as FIG. 3B shows that inner surfaces of outer layer 110 move away from each other during expansion of the compressible material.

The compressible material 120 may be formed from a variety materials including, but not limited to, an open cell, closed cell, charcoal, or acoustical type foam product. For example, the foam product may be made from PE, Neoprene, or PP. The compressible material 120 should be selected to be compressible during formation of the self-expanding gap filler 100 and expandable once the seal is released. Preferably, the compressible material 120 will not shrink or will only marginally shrink over time.

According to this first exemplary embodiment, the self-expanding gap filler 100 provides a thin flexible product that can be placed in a desired location, after which, the seal is at least partially released and the compressible material 120 expands to cause the outer layer 110 and the compressible material 120 to at least partially fill or block a gap by extending between sides of the gap between adjacent elements. There are many different ways to partially or wholly release the seal including puncturing the outer layer, cutting one of the sealed sides to open the inner space, and the like. Accordingly, the self-expanding gap filler 100 can at least partially fill or block gaps between one or more adjacent elements of a data center once the seal is at least partially released.

Figure 4:
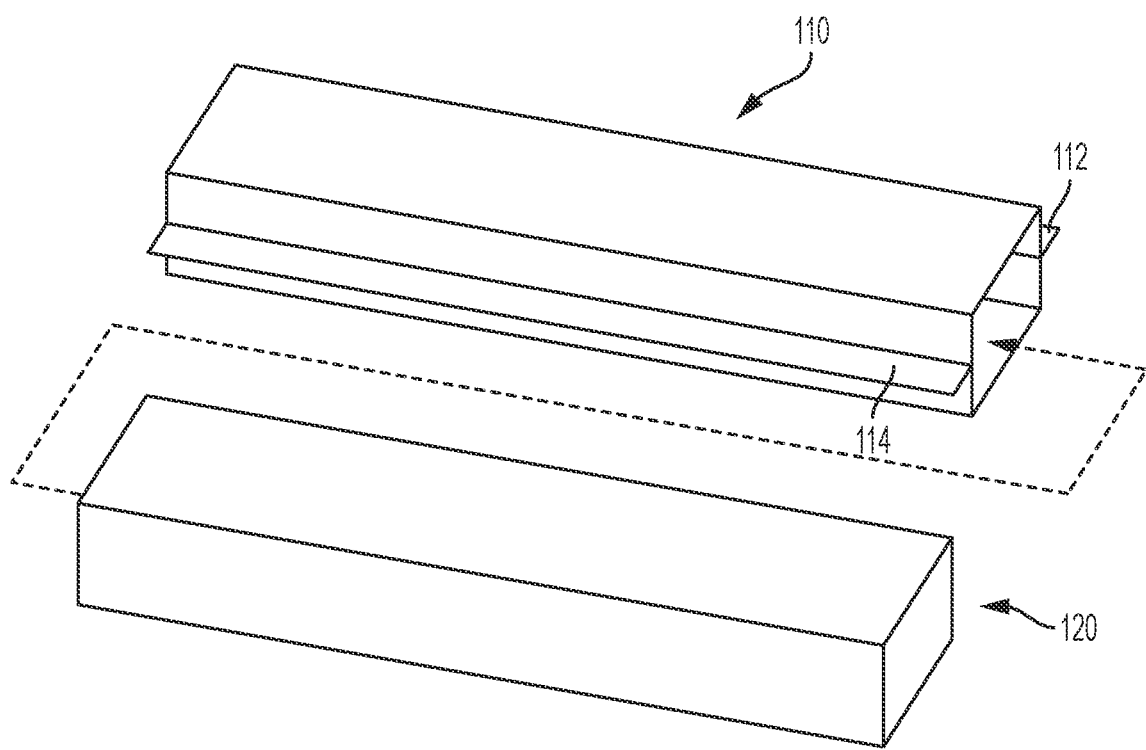
FIG. 4 illustrates a perspective view of the components of the self-expanding gap filler according to the first embodiment.

As shown in FIG. 4, prior to assembling the self-expanding gap filler 100, the outer layer 110 may be provided as a tubular member with sealed edges 112, 114 preformed in the two long sides of the tubular member, and the compressible material 120 may be provided as a foam insert to be inserted into the outer layer 110. The compressible material 120 may be inserted into the tubular member by being pulled through one end of the tubular member. As such, neither of the short sides 116, 118 is sealed prior to insertion of the compressible member 120.

Once the compressible material 120 is inserted into the outer layer 110, one of the two short sides 116, 118 is sealed using conventional techniques such as a heat seal. After sealing one of the two short sides 116, 118, the combined compressible material 120 and outer layer 110 may be pressed using a press or other mechanical means to compress the compressible material 120 within the outer layer 110. Preferably, the compressible material is held in the compressed state by the press or other mechanical means while the other of the two short sides 116, 118 is being vacuumed sealed. Vacuum sealing involves the application of a vacuum to the inner space, as well as sealing one of the two short sides 116, 118 by, for example, a heat seal. In this manner, the self-expanding gap filler 100 is formed to have the thin profile.

Depending on the type of vacuum sealing device used, an additional separate seal may be provided closer to the compressible material 120 at the other of the two short sides 116, 118 so that excess material can be trimmed from the self-expanding gap filler 100. By applying a vacuum seal, the compressible material 120 can be compressed a greater amount than that achievable by simply using a press or mechanical to compress the compressible material 120 prior to sealing the compressible material 120 in the outer layer.

While one particular approach to forming the self-expanding gap filler 100 has been described, it is understood that other approaches could be used to form the self-expanding gap filler 100. For example, the step of providing a vacuum seal could be eliminated if the press or other mechanical means could sufficiently compress the compressible material 120 to provide a desired thickness for the self-expanding gap filler 100 in the compressed state.

Figure 5:
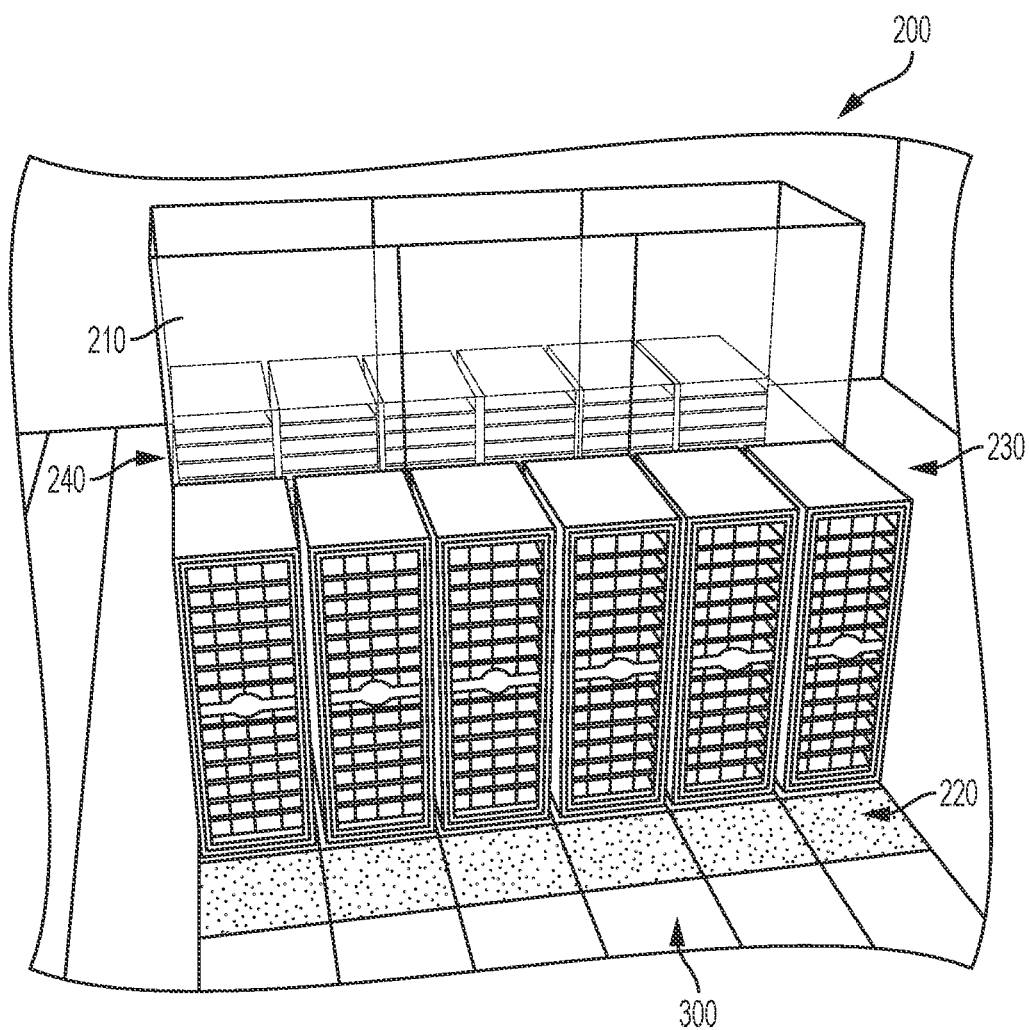
FIG. 5 illustrates a perspective view of a data center including a plurality of server rack cabinets.

One or more self-expanding gap fillers 100 may be placed between adjacent elements in a data center to at least partially fill or block gaps between the adjacent elements of the data center to decrease or prevent air leakage between a hot aisle and a cold aisle. In particular, as shown in FIG. 5, a data center 200 may include a hot aisle 210, a cold aisle 220, a first plurality of server rack cabinets 230 and a second plurality of server rack cabinets 240. Each of the server rack cabinets 230, 240 may include one or more computing devices 232, 242. In this arrangement, the hot aisle 210 is located at the rear of the server rack cabinets 230, 240 and the cold aisle 220 is located at the front of the server rack cabinets 230. While not labeled, another cold aisle is located at the front of the server rack cabinets 240. Hot aisles and cold aisle are well known and therefore specific descriptions thereof are not set forth herein.

Figure 6:
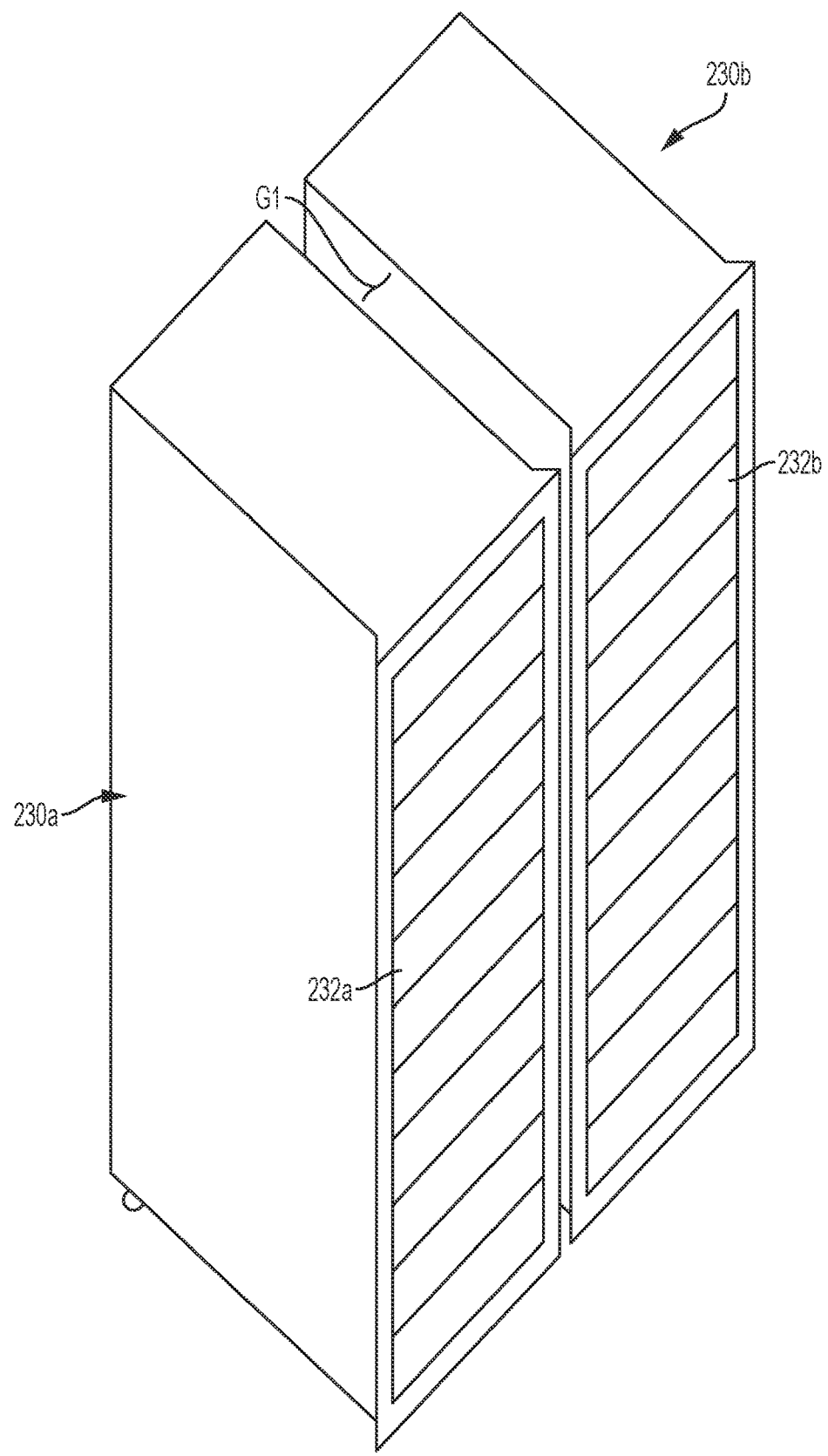
FIGS. 6 and 7 illustrate a gap formed between adjacent server rack cabinets of the data center of FIG. 5.
Figure 7:
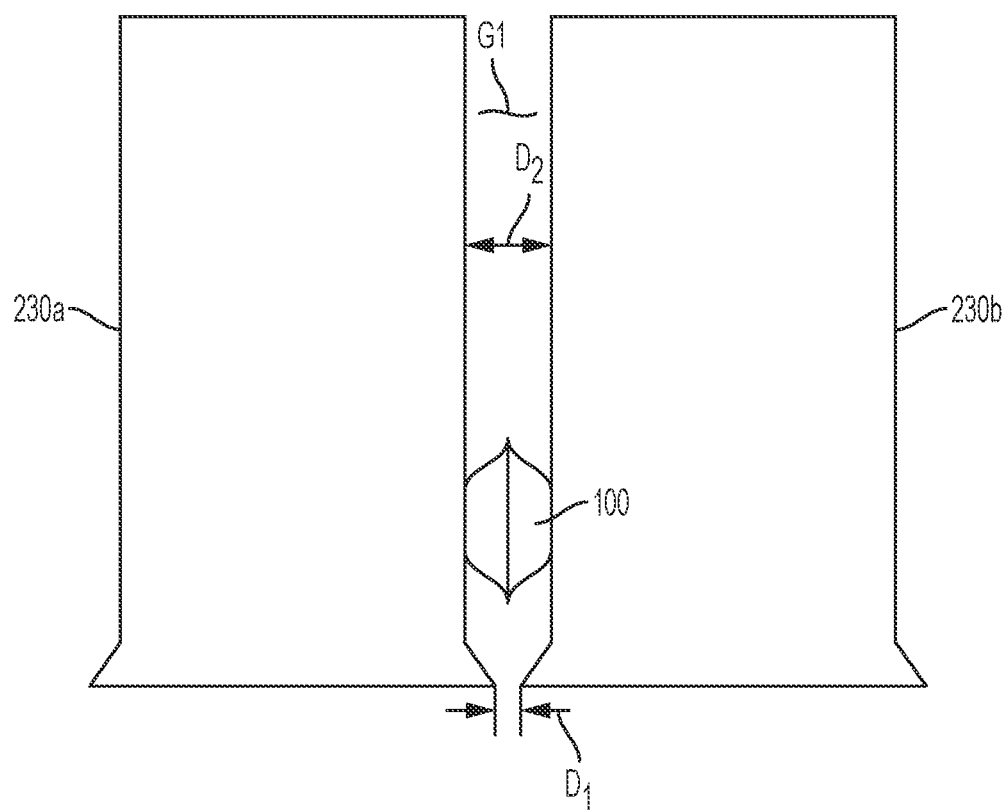

Whenever a plurality of server rack cabinets are arranged in a row, it is common for gaps to be formed between adjacent server rack cabinets. If these gaps are not at least partially filled or blocked, it is possible that too much air may leak from the hot aisle to the cold aisle, thereby detrimentally decreasing the efficiency of the cooling system using the hot and cold aisles. FIGS. 6 and 7 schematically represent two adjacent server rack cabinets 230a, 230b of the first plurality of server rack cabinets 230. A plurality of computing devices 232a, 232b are provided within the server rack cabinets 230a, 230b. The server rack cabinets 230a, 230b may include wheels at a bottom of the respective server rack cabinets. A gap G1 is formed between adjacent sides of the two server rack cabinets 230a, 230b. In this particular arrangement, the gap G1 may have a first width D1 at the front of the server rack cabinets 230a, 230b and have a second width D2 near the rear of the server rack cabinets 230a, 230b. Depending on the configuration of the server rack cabinets 230a, 230b, the first width D1 may be less than the second width D2. For example, the first width D1 may be % of an inch while the second width D2 may be 2½ inches.

Because of the relative sizes of the gap G1, it is often difficult to partially fill or block gap G1 from the front of the server rack cabinets 230a, 230b. By using a self-expanding gap filler 100, it is possible to insert the self-expanding gap filler 100 through the first width D1 of gap G1, then at least partially release the seal so that the self-expanding gap filler 100 fills the second width D2 of the gap G1 between the adjacent server rack cabinets 230a, 230b. That is, the self-expanding gap filler 100 may be less than % of an inch when in the compressed state and may expand to 2½ inches to at least partially fill or block the gap G1. It is understood that the self-expanding gap filler may have different sizes in the compressed state and the expanded state to fit different gaps.

Figure 8:
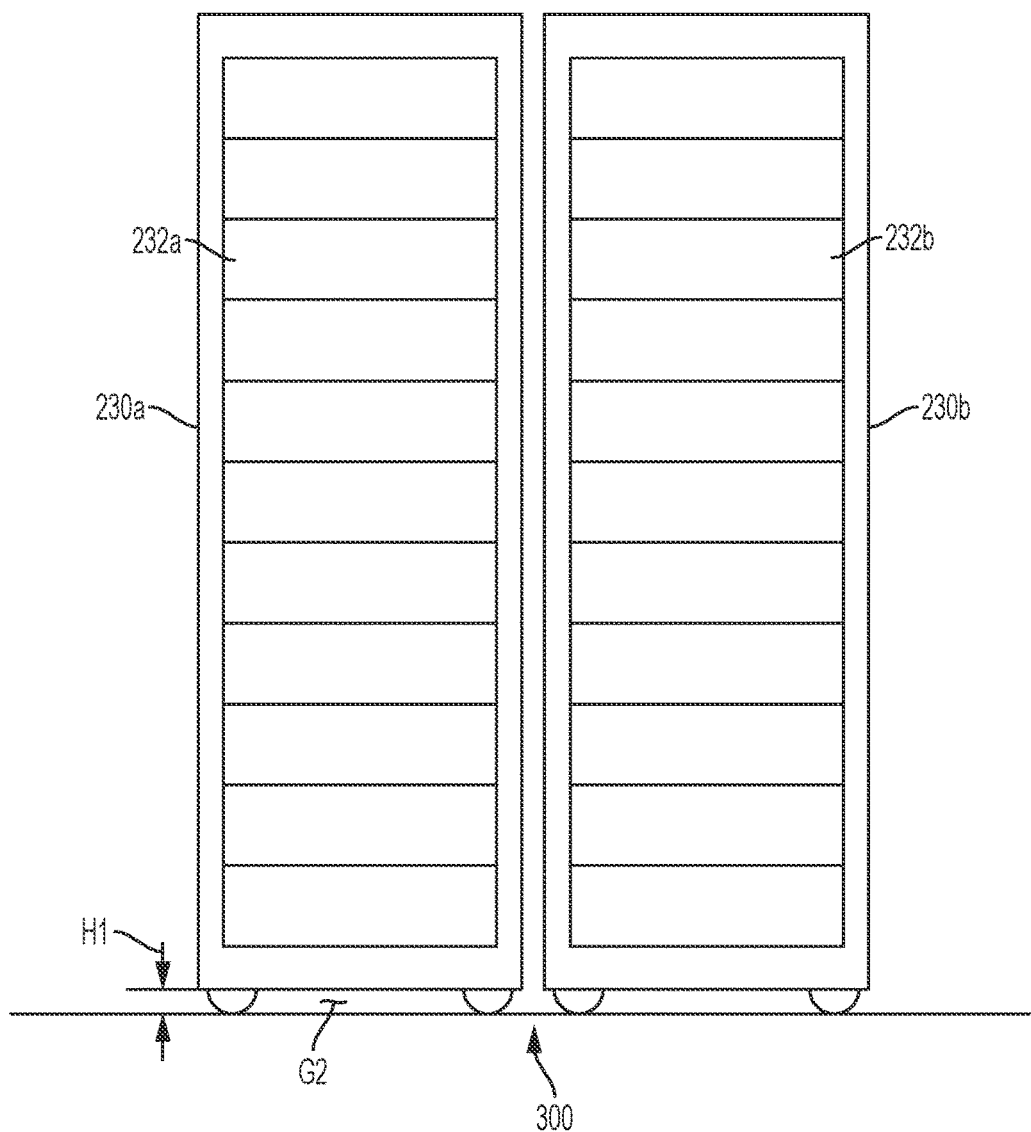
FIGS. 8 and 9 illustrate a gap between a server rack cabinet and floor of the data center of FIG. 5.
Figure 9:
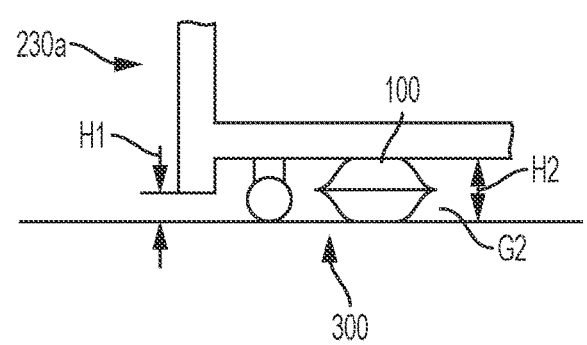

In addition to having gap G1 between adjacent server rack cabinets 230a, 230b, a gap G2 may exist between a bottom of the server rack cabinet 230a and a floor 300 where a data center is located, as shown in FIGS. 8 and 9. The gap G2 may exist because of rollers located at the bottom of the server rack cabinet 230a or other means used for spacing the bottom of the server rack cabinet 230a from the floor 300. In addition, the gap G2 may have a first height H1 at the front of the server rack cabinets 230a, 230b and have a second height H2 near the rear of the server rack cabinets 230a, 230b. Similar to the arrangement shown in FIGS. 6 and 7, the first height H1 may be less than the second height H2.

Similar to the arrangement described above, a self-expanding gap filler 100 may be inserted from the front of the server rack cabinet 230a so as to be located either behind the rollers or in front of the rollers. Then, the seal of the self-expanding gap filler 100 is at least partially released to at least partially fill or block the gap G2 between the bottom of the server rack cabinet 230a and the floor 300.

Figure 10:
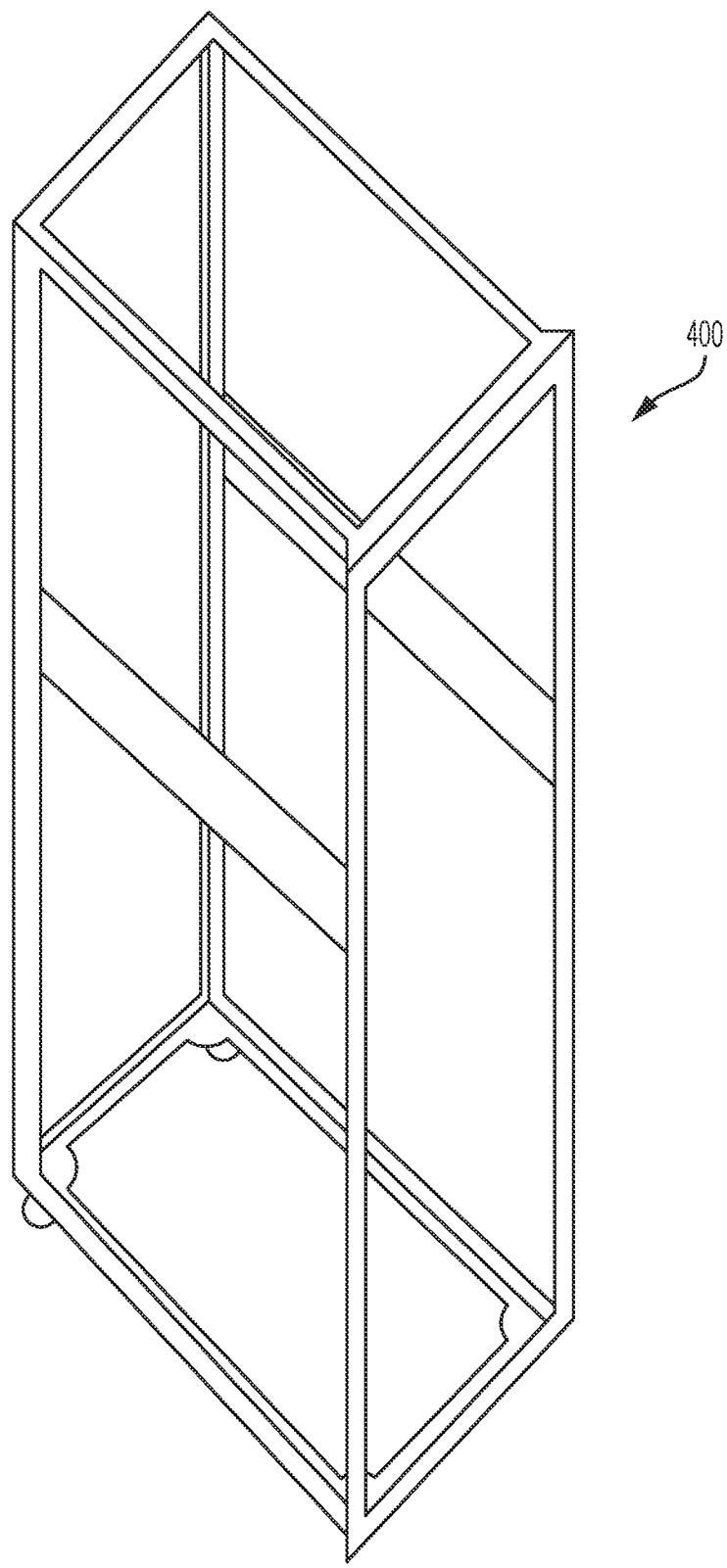
FIG. 10 illustrates a frame of a server rack cabinet.

While the server rack cabinets 230a and 230b shown in FIGS. 6-9 have been depicted as having smooth outer surfaces for ease of explanation, it is understood that the server rack cabinets may take various forms and/or have irregular surfaces that would make it difficult to at least partially fill or block a gap using conventional techniques. For example, FIG. 10 shows an open frame 400 for a server rack cabinet that does not have smooth surfaces to define the exterior of the server rack cabinet. As such, depending on the size and number of computing devices mounted therein, the exterior of the server rack cabinet may present irregular side surfaces and bottom surfaces. As such, gaps between adjacent server rack cabinets and between bottoms surfaces and the floor may vary over the height or width of the server rack cabinets, which can be difficult to partially fill or block. The self-expanding gap filler 100 can accommodate these irregularities as the compressible material expands outwards to at least partially fill or block the gaps. In addition, the self-expanding gap filler 100 can be located at various locations to at least partially fill or block the gaps.

In addition to inserting the self-expanding gap filler 100 either vertically or horizontally to extend across a gap between adjacent server rack cabinets or between a server rack cabinet and a floor without bending the self-expanding gap filler 100, it is possible to fold the self-expanding gap filler 100 to at least partially fill or block a particular gap shape. For example, the self-expanding gap filler could be folded into a u-shape configuration to extend along the sides and rear of the frame 400. In this manner, three sides of the bottom of the frame 400 can prevent air from flowing from a hot aisle to a cold aisle. Alternatively, the self-expanding gap filler can be pre-formed to have various shapes.

Figure 11:
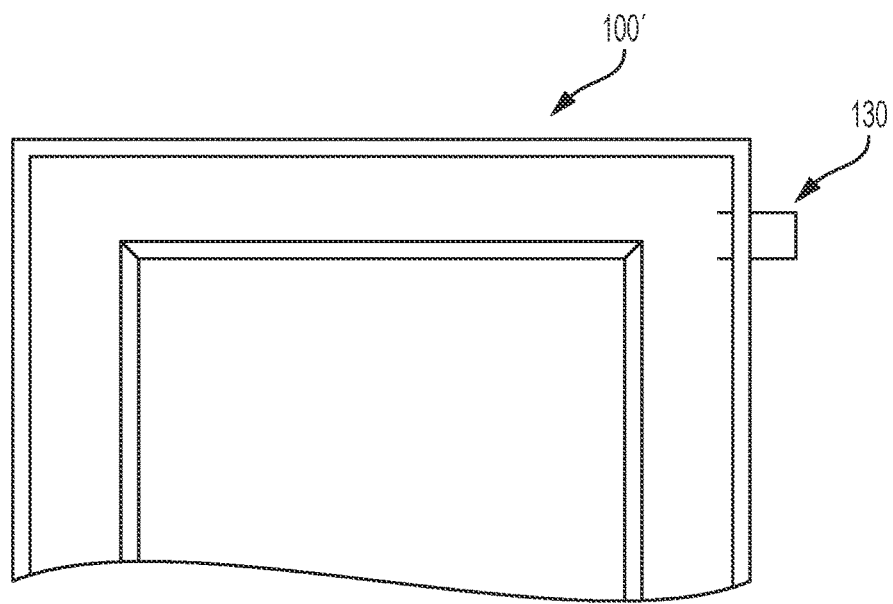
FIGS. 11 and 12 illustrate alternative seal arrangements of a self-expanding gap filler according to other exemplary embodiments of the present invention.

While the first embodiment of the self-expanding gap filler has been described as being formed with four sealed edges to encapsulate the compressible material in a compressed state, a self-expanding gap filler 100', as shown in FIG. 11, may be provided with a valve 130 provided in one of the sides that allows for applying/releasing a seal. The remaining features of the self-expanding gap filler 100' are similar to the self-expanding gap filler 100 described above.

The valve 130 may be a twistable valve or a Schrader valve. In this manner, it is possible to reuse the self-expanding gap filler 100' by simply recompressing the compressible material and reapplying a vacuum to the interior of the outer layer.

Figure 12:
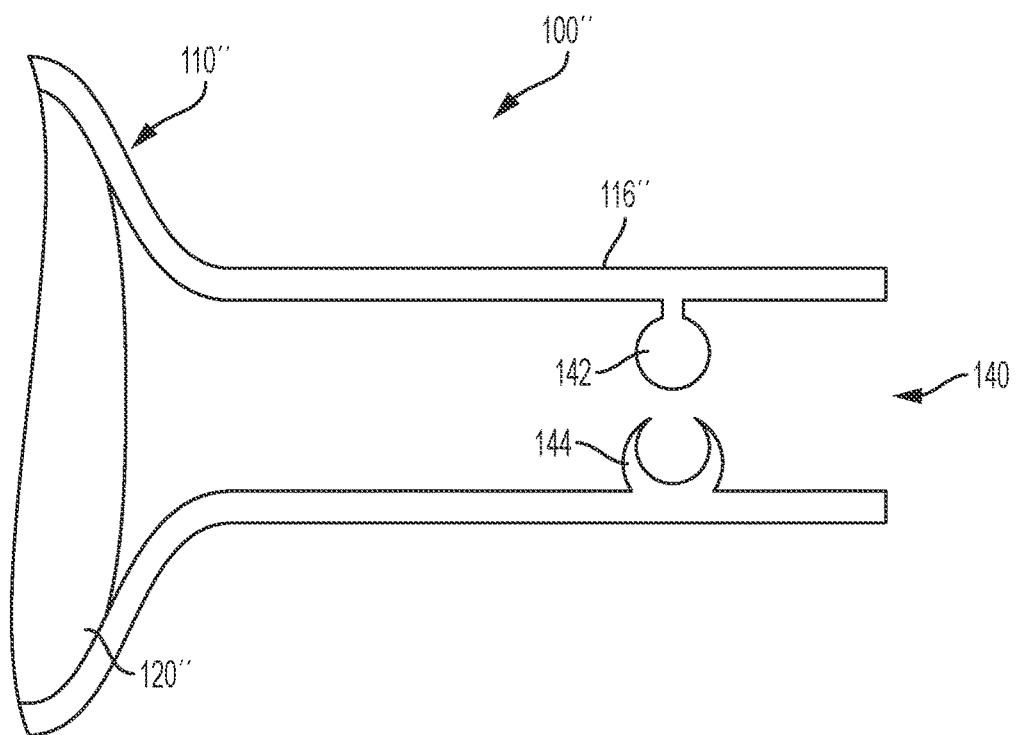

Another self-expanding gap filler 100", as shown in FIG. 12, may be provided with a rib and groove closure 140 in one of the short sides 116". The rib and groove closure 140 includes a rib 142 configured to be pressed into groove 144 to seal the outer layer 110". The remaining features of the self-expanding gap filler 100", including the outer layer 110" and compressible material 120", are similar to the self-expanding gap filler 100 described above.

Although the self-expanding gap filler of the present invention has been described generally as being installed in an existing data center after the server rack cabinets are in place, it is also envisioned that the self-expanding gap filler may be pre-installed in a compressed state along one or more of side, top and bottom surfaces of the server rack cabinets, such as by using an adhesive or hook-and-loop fasteners to attach the self-expanding gap filler to one or more of side, top and bottom surfaces of the server rack cabinets, prior to installation of the server rack cabinets in the data center, and then expanded, by puncturing of the outer layer or other methods described herein, after the server rack cabinets are in place within the data center. Alternatively, in data centers utilizing stalls as previously described, it is envisioned that the self-expanding gap filler may be pre-installed in a compressed state along one or more of side, top and bottom surfaces of the stall, such as by using an adhesive or hook-and-loop fasteners to attach the self-expanding gap filler to one or more of side, top and bottom surfaces of the stall, prior to installation of a server rack cabinet in the stall, and then expanded, by puncturing the outer layer or other methods described herein, after the server rack cabinet is in place within the stall.

The invention thus being described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A self-expanding gap filler positionable between adjacent elements in a data center, the self-expanding gap filler comprising:
    a compressible material; and
    an outer layer having an outer surface and an inner surface, the inner surface configured to define a sealed inner space, the outer layer configured to encapsulate the compressible material in a compressed state within the inner space,
    wherein the compressible material is configured to expand from the compressed state within the inner space of the outer layer to an expanded state within the inner space of the outer layer,
    wherein an overall width of the self-expanding gap filler when the compressible material is in the expanded state is less than six inches, and
    wherein an overall thickness of the self-expanding gap filler when the compressible material is in the expanded state is between 1 to 3.5 inches.

2. The self-expanding gap filler according to claim 1, wherein at least one of the adjacent elements comprises a server rack in the data center, and
    wherein the self-expanding gap filler at least partially fills a gap between the adjacent elements in the data center when the compressible material is in the expanded state.

3. The self-expanding gap filler according to claim 1, wherein the outer layer has a tubular shape with two sealed long edges and two sealed short edges.

4. The self-expanding gap filler according to claim 1, wherein the outer layer comprises Polyethylene (PE), Polypropylene (PP), Polyvinylchloride (PVC), Polyester (PET), or Polyamide (PA).

5. The self-expanding gap filler according to claim 1, wherein the compressible material comprises open cell foam, closed cell foam, charcoal foam, or acoustical foam.

6. The self-expanding gap filler according to claim 1, further comprising a valve connected to the outer layer, the valve being configured to at least temporarily release the sealed inner space.

7. The self-expanding gap filler according to claim 1, wherein the outer layer is configured to be punctured or cut to release the sealed inner space.

8. The self-expanding gap filler according to claim 1, wherein at least one of the adjacent elements comprises a server rack in the data center,
wherein the self-expanding gap filler at least partially fills a gap between the adjacent elements in the data center when the compressible material is in the expanded state,
wherein the outer layer comprises Polyethylene (PE), Polypropylene (PP), Polyvinylchloride (PVC), Polyester (PET), or Polyamide (PA), and
wherein the compressible material comprises open cell foam, closed cell foam, charcoal foam, or acoustical foam.

9. A self-expanding gap filler positionable between adjacent elements in a data center, the self-expanding gap filler comprising:
a compressible material; and
an outer layer having an outer surface and an inner surface, the inner surface configured to define a sealed inner space, the outer layer configured to encapsulate the compressible material in a compressed state within the inner space,
wherein the compressible material is configured to expand from the compressed state within the inner space of the outer layer to an expanded state within the inner space of the outer layer,
wherein an overall width of the self-expanding gap filler when the compressible material is in the expanded state is less than six inches, and
wherein an overall length of the self-expanding gap filler is in a range of 24 inches to 30 inches.

10. The self-expanding gap filler according to claim 9, wherein at least one of the adjacent elements comprises a server rack in the data center, and
wherein the self-expanding gap filler at least partially fills a gap between the adjacent elements in the data center when the compressible material is in the expanded state.

11. The self-expanding gap filler according to claim 9, wherein the outer layer has a tubular shape with two sealed long edges and two sealed short edges.

12. The self-expanding gap filler according to claim 9, wherein the outer layer comprises Polyethylene (PE), Polypropylene (PP), Polyvinylchloride (PVC), Polyester (PET), or Polyamide (PA).

13. The self-expanding gap filler according to claim 9, wherein the compressible material comprises open cell foam, closed cell foam, charcoal foam, or acoustical foam.

14. The self-expanding gap filler according to claim 9, further comprising a valve connected to the outer layer, the valve being configured to at least temporarily release the sealed inner space.

15. The self-expanding gap filler according to claim 9, wherein the outer layer is configured to be punctured or cut to release the sealed inner space.

16. The self-expanding gap filler according to claim 9, wherein at least one of the adjacent elements comprises a server rack in the data center,
wherein the self-expanding gap filler at least partially fills a gap between the adjacent elements in the data center when the compressible material is in the expanded state,
wherein the outer layer comprises Polyethylene (PE), Polypropylene (PP), Polyvinylchloride (PVC), Polyester (PET), or Polyamide (PA), and
wherein the compressible material comprises open cell foam, closed cell foam, charcoal foam, or acoustical foam.

* * * * *